United States Patent
Sakakibara

(10) Patent No.: US 9,588,200 B2
(45) Date of Patent: Mar. 7, 2017

(54) METHOD FOR ADJUSTING STATIC MAGNETIC FIELD HOMOGENEITY, STATIC MAGNETIC FIELD GENERATION DEVICE FOR MAGNETIC RESONANCE IMAGING, MAGNETIC FIELD ADJUSTMENT SYSTEM, AND PROGRAM

(75) Inventor: Kenji Sakakibara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 773 days.

(21) Appl. No.: 14/006,182

(22) PCT Filed: Mar. 15, 2012

(86) PCT No.: PCT/JP2012/056617
§ 371 (c)(1),
(2), (4) Date: Sep. 19, 2013

(87) PCT Pub. No.: WO2012/132911
PCT Pub. Date: Oct. 4, 2012

(65) Prior Publication Data
US 2014/0009152 A1    Jan. 9, 2014

(30) Foreign Application Priority Data

Mar. 25, 2011  (JP) .................................. 2011-067545

(51) Int. Cl.
*G01V 3/00* (2006.01)
*G01R 33/3873* (2006.01)
*G01R 33/38* (2006.01)

(52) U.S. Cl.
CPC ..... *G01R 33/3873* (2013.01); *G01R 33/3802* (2013.01)

(58) Field of Classification Search
CPC .................................................. G01R 33/3802
(Continued)

(56) References Cited

U.S. PATENT DOCUMENTS

| 4,771,243 A | 9/1988 | Vreugdenhil et al. |
| 5,003,276 A | 3/1991 | Sarwinski et al. |

(Continued)

FOREIGN PATENT DOCUMENTS

| JP | 62-47349 | 3/1987 |
| JP | 2001-68327 | 3/2001 |

(Continued)

OTHER PUBLICATIONS

International Search Report in PCT/JP2012/056617.

*Primary Examiner* — Louis Arana
(74) *Attorney, Agent, or Firm* — Cooper & Dunham LLP

(57) ABSTRACT

In order to avoid the duplication of the period and cost required for magnetic field adjustment, minimize the magnetic field adjustment period in a final installation site, and achieve highly efficient magnetic field adjustment of a magnet, a method for adjusting the homogeneity of a static magnetic field generated in a measurement space by a static magnetic field generation means by disposing magnetic field correction means for generating a corrected magnetic field with respect to the static magnetic field comprises: a step for measuring the static magnetic field generated by the static magnetic field generation means; a step for expanding the spatial distribution of the measured static magnetic field in a series; a first magnetic field adjustment step for correcting a high-order term irregular magnetic field components expanded in a series; and a second step for adjusting a low-order irregular magnetic field component, the second step being performed after the first adjustment step.

12 Claims, 19 Drawing Sheets

(58) Field of Classification Search
USPC .................................................. 324/319, 320
See application file for complete search history.

(56) References Cited

U.S. PATENT DOCUMENTS

| | | | | |
|---|---|---|---|---|
| 5,235,284 A | * | 8/1993 | Tahara ............... | G01R 33/3873 |
| | | | | 324/318 |
| 5,237,275 A | * | 8/1993 | Takechi ............. | G01R 33/3875 |
| | | | | 324/319 |
| 5,418,462 A | * | 5/1995 | Breneman .......... | G01R 33/3873 |
| | | | | 324/319 |
| 2006/0001427 A1 | | 1/2006 | Ando et al. | |
| 2007/0030004 A1 | | 2/2007 | Amor et al. | |

FOREIGN PATENT DOCUMENTS

| | | |
|---|---|---|
| JP | 2006-43426 | 2/2006 |
| JP | 2007-500050 | 1/2007 |

\* cited by examiner

FIG.3
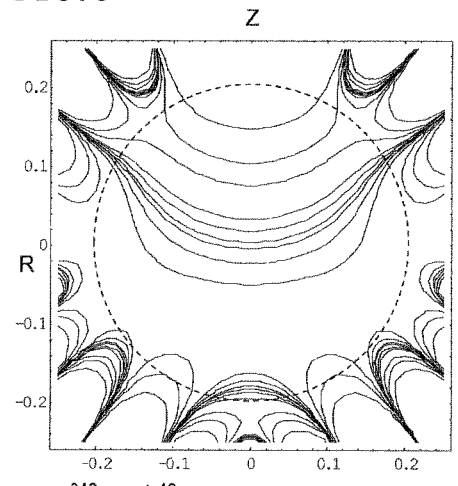
240ppm at 40cm
FROM INSIDE
+/-1, +/-5, +/-10, +/-30, +/-50, +/-100[ppm]
(a)
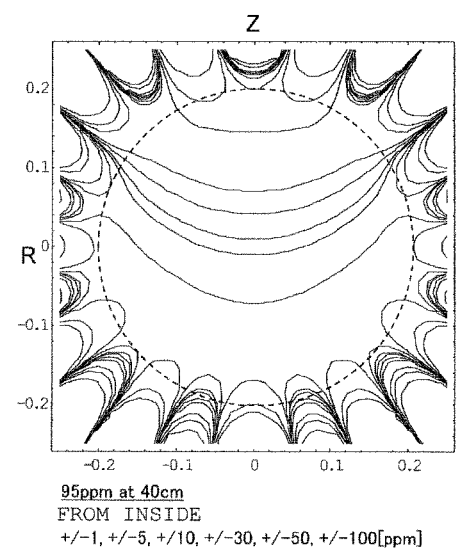
95ppm at 40cm
FROM INSIDE
+/-1, +/-5, +/-10, +/-30, +/-50, +/-100[ppm]
(b)
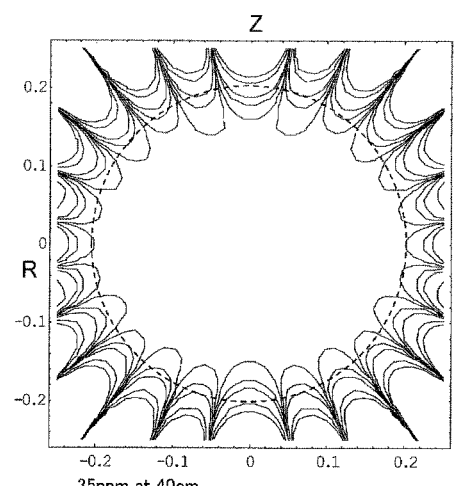
35ppm at 40cm
FROM INSIDE
+/-1, +/-5, +/10, +/-30, +/-50, +/-100[ppm]
(c)

FIG.16

| TRAY TO BE USED | FIRST TRAY |
|---|---|
| SHIM IRON TO BE USED | A |
| | B |

| | | AMOUNT OF IRREGULAR MAGNETIC FIELD [ppm] | DETERMINED VALUE OF HIGH-ORDER TERM |
|---|---|---|---|
| TERMS OF SERIES EXPANSION Za(N,M), Zb(N,M) | A(0,0) | 10000001.2 | N.A |
| | A(1,0) | 32.0 | N.A |
| | A(2,0) | 25.0 | N.A |
| | A(3,0) | 15.0 | N.A |
| | A(4,0) | 8.5 | −10<, <10 |
| | A(5,0) | 0.0 | −3<, <3 |
| | A(6,0) | 8.4 | −10<, <10 |
| | A(7,0) | −4.4 | −5<, <5 |
| | A(8,0) | 10.2 | N.A |
| | A(9,0) | 0.6 | N.A |
| | A(10,0) | −12.0 | N.A |
| | A(1,1) | 8.0 | N.A |
| | B(1,1) | 11.1 | N.A |
| | A(2,1) | 14.0 | N.A |
| | A(2,2) | 12.0 | N.A |
| | B(2,1) | 0.1 | N.A |
| | B(2,2) | 0.0 | N.A |
| | A(3,1) | −0.1 | N.A |
| | A(3,2) | −0.1 | N.A |
| | A(3,3) | 0.0 | N.A |
| | B(3,1) | −0.2 | N.A |
| | B(3,2) | −0.1 | N.A |
| | B(3,3) | 0.0 | N.A |
| | A(4,1) | 0.0 | N.A |
| | A(4,2) | 2.5 | N.A |
| | A(4,3) | 0.0 | N.A |
| | A(4,4) | 0.1 | N.A |
| | B(4,1) | −0.1 | N.A |
| | B(4,2) | −0.1 | N.A |
| | B(4,3) | −0.1 | N.A |
| | B(4,4) | 0.0 | N.A |
| | A(5,1) | 3.5 | −5<, <5 |
| | A(5,2) | 0.0 | −5<, <5 |
| | A(5,3) | 0.0 | −5<, <5 |
| | A(5,4) | 0.0 | −5<, <5 |
| | A(5,5) | 0.0 | −5<, <5 |
| | B(5,1) | −2.1 | −5<, <5 |
| | B(5,2) | 0.1 | −5<, <5 |
| | B(5,3) | 0.1 | −5<, <5 |
| | B(5,4) | −0.1 | −5<, <5 |
| | B(5,5) | −0.1 | −5<, <5 |

| TRAY TO BE USED | SECOND TRAY |
|---|---|
| SHIM IRON TO BE USED | C |
|  | D |

| | | AMOUNT OF IRREGULAR MAGNETIC FIELD [ppm] |
|---|---|---|
| TERMS OF SERIES EXPANSION Za(N,M), Zb(N,M) | A(0,0) | 10000001.2 |
| | A(1,0) | 3.2 |
| | A(2,0) | 5.0 |
| | A(3,0) | 2.5 |
| | A(4,0) | 3.2 |
| | A(5,0) | 0.0 |
| | A(6,0) | 7.5 |
| | A(7,0) | -4.4 |
| | A(8,0) | 10.5 |
| | A(9,0) | 0.6 |
| | A(10,0) | -12.3 |
| | A(1,1) | 2.5 |
| | B(1,1) | 1.2 |
| | A(2,1) | 2.0 |
| | A(2,2) | 3.3 |
| | B(2,1) | 0.1 |
| | B(2,2) | 0.0 |
| | A(3,1) | -0.1 |
| | A(3,2) | -0.1 |
| | A(3,3) | 0.0 |
| | B(3,1) | 2.1 |
| | B(3,2) | -0.1 |
| | B(3,3) | 0.0 |
| | A(4,1) | 0.0 |
| | A(4,2) | -0.2 |
| | A(4,3) | 0.0 |
| | A(4,4) | 0.1 |
| | B(4,1) | -0.1 |
| | B(4,2) | -0.1 |
| | B(4,3) | -0.1 |
| | B(4,4) | 0.0 |
| | A(5,1) | 0.0 |
| | A(5,2) | 0.0 |
| | A(5,3) | 0.0 |
| | A(5,4) | 0.0 |
| | A(5,5) | 0.0 |
| | B(5,1) | -0.1 |
| | B(5,2) | 0.1 |
| | B(5,3) | 0.1 |
| | B(5,4) | -0.1 |
| | B(5,5) | -0.1 |

FIG.19

| TRAY TO BE USED | SECOND TRAY |
|---|---|

| SHIM IRON TO BE USED | THICKNESS [mm] | WIDTH [mm] × LENGTH [mm] |
|---|---|---|
| C | 0.5 | 15×10 |
| D | 0.01 | 15×10 |

| TRAY NUMBER \ POCKET NUMBER | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | C | D | C | D | C | D | C | D | C | D | C | D | C | D | C | D | C | D | C | D | C | D | C | D |
| 2  | 1 | 1 |   | 1 |   |   | 1 | 2 |   |   |   |   |   |   | 3 | 2 |   |   |   |   |   |   |   |   |
| 4  | 1 |   |   |   |   |   |   |   |   |   |   |   |   |   |   |   |   |   |   |   |   |   |   |   |
| 6  |   | 2 |   |   |   |   |   |   |   |   |   |   |   |   |   |   |   |   |   |   |   |   |   |   |
| 8  |   |   |   |   |   |   |   |   | 5 | 3 |   |   |   |   |   |   |   | 3 |   |   |   |   |   |   |
| 10 |   | 1 |   |   |   |   |   |   | 2 | 3 |   |   |   |   |   |   | 2 | 3 |   | 2 |   |   |   |   |
| 12 |   |   |   |   |   |   |   |   |   |   |   |   |   |   |   |   |   |   | 1 |   |   |   |   |   |
| 14 |   |   |   | 1 |   |   | 1 | 2 |   |   |   |   |   |   | 1 | 2 |   |   |   |   | 1 |   |   | 2 |
| 16 |   | 1 |   |   |   |   |   |   | 1 | 2 |   |   |   |   |   |   |   |   | 1 | 2 |   |   | 1 |   |
| 18 | 2 | 3 |   |   |   |   |   |   |   |   |   |   |   |   |   |   |   |   |   | 1 |   |   | 1 |   |
| 20 |   |   |   |   |   |   |   |   |   |   |   |   |   |   | 2 | 2 | 2 | 3 |   | 3 |   |   |   | 5 |
| 22 | 1 |   |   |   |   |   |   |   |   |   |   |   |   |   |   |   |   |   |   |   |   |   |   |   |
| 24 |   |   |   |   |   |   |   |   |   |   |   |   |   |   |   |   |   |   |   |   |   |   | 1 |   |

METHOD FOR ADJUSTING STATIC MAGNETIC FIELD HOMOGENEITY, STATIC MAGNETIC FIELD GENERATION DEVICE FOR MAGNETIC RESONANCE IMAGING, MAGNETIC FIELD ADJUSTMENT SYSTEM, AND PROGRAM

FIELD OF THE INVENTION

The present invention relates to a static magnetic field generation device using a superconducting magnet, particularly to a technique for adjusting the magnetic field homogeneity of a static magnetic field generation device for magnetic resonance imaging (MRI).

DESCRIPTION OF RELATED ART

In MRI for obtaining high quality MRI images, high homogeneity and high magnetic field are required of a static magnetic field generation device. Currently, a superconducting magnet has been used generally to fulfill this need.

A static magnetic field generation device is designed to maintain the homogeneity of a static magnetic field mainly by the placement position of a superconducting magnet so that necessary homogeneous magnetic fields are generated in a desired space. However in reality, acquisition of desired magnetic field homogeneity is difficult due to measurement errors in fabrication of superconducting magnets, thus magnetic field adjustment means for fine-adjustment of a static magnetic field (hereinafter referred to as shimming) using a minute magnetic shim iron referred to as a passive shim has been provided to a static magnetic field generation device.

An example of general shimming procedure is as follows. First, the spatial distribution of a magnetic field in a desired imaging space is measured by a magnetic field measuring probe. Next, the measured magnetic field distribution is expanded in a series of the sum of a polynominal such as Legendre polynominal, so as to calculate the inhomogeneity of the magnetic field. On the basis of the result, the placement positions and placement quantity of magnetic shims are determined for negating the inhomogeneity of the magnetic field. The homogeneity is improved by repeating these steps.

The conventional shimming has a problem, when high homogeneity is being attained, that the adjustment of inhomogeneity becomes more difficult as the higher homogeneity is attained, whereby prolonging the adjustment time. Also, since placement operation of shim irons is difficult in an intense magnetic field of a superconducting magnet, the shim irons need to be replaced and excited each time after the superconducting magnetic is demagnetized. At this time, a large amount of liquid helium needs to be consumed for demagnetization and excitation. Accordingly, demagnetization and excitation need to be executed at each operation of iron placement, which requires large consumption of expensive liquid helium.

In relation to the requirement of improved homogeneity, Patent Document 1 discloses a technique which acquires spherical harmonics coefficient from the magnetic field distribution measurement data measured in a comparatively large imaging space and reconstructs the magnetic field in a space which is smaller than the previously mentioned imaging space, for improving the homogeneity in the small space. Also, in relation to the problem of prolonged shimming time, Patent Document 3 discloses a technique that divides the process of adjustment into two steps in which the adjustment is performed until the homogeneity is reached to a predetermined value in the former step by using a comparatively large shim iron and the homogeneity is raised in the latter step by using a comparatively small shim iron. Patent Document 2 also discloses a technique in which the shimming step is divided into two times which are before shipment of a static magnetic field generation device and the installation site thereof, so that the shimming time at the installation site can be reduced by achieving intended homogeneity in the shimming before shipment and performing the adjustment with comparatively low number of terms in the shimming at the installation site.

PRIOR ART DOCUMENTS

Patent Documents

Patent Document 1: JP-A-2001-87245
Patent Document 2: JP-A-2008-289717
Patent Document 3: JP-A-H03-215246

SUMMARY OF INVENTION

Technical Problem

Superconducting magnets which generate high magnetic field have a problem in which the magnetic field that leaks outside of the magnet (hereinafter referred to as magnetic field leakage) spreads to a large extent, causing inhomogeneity of a static magnetic field. For example, the spreading of the 5 gauss line caused by the magnetic field leakage of a superconducting magnet having about 1.5~3.5 tesla in the central magnetic field is about 4.5 meters in the axis direction and about 2.3 meters in the radial direction from the central magnetic field, which could reach the outside of the imaging room. By this leakage, ferromagnetic construction materials such as iron placed in the periphery of the final installation site of a superconducting magnet or magnetic shielding materials such as electromagnetic soft iron placed for suppressing the magnetic field leakage are magnetized, thereby deteriorating the homogeneity of the static magnetic field in the imaging space. Therefore, magnetic field adjustment needs to be performed once again after being placed in the final installation site, for correcting the inhomogeneity of the static magnetic field caused by the magnetization from outside of the magnet (referred to as "irregular magnetic field by the environmental magnetic field").

In a case, as disclosed in Patent Document 3, that the technique of executing shimming before factory shipment and at the final installation site respectively is applied, even intended static magnetic field homogeneity is attained before factory shipment, if a large amount of magnetic field leakage is generated by a magnet such as a superconducting magnet at the installation site with a measurable amount of irregular magnetic field due to the environmental magnetic field, the similar extent of shimming needs to be performed at the site which requires a long period of time for the adjustment, which leaves problems such as increase of man-hour and heavy consumption of liquid helium. The technique disclosed in Patent Document 2 has the similar problem. Also, Patent Document 2 has another problem of ineffective workability, since it requires the operation of attaching and detaching a second iron shim in the latter step to and from the tray (base) on which a first iron shim is already placed in the former step.

Considering the above-described problems, the objective of the present invention is to avoid time and cost consumption for magnetic field adjustment by minimizing the magnetic field adjustment time at the final installation site and improving the efficiency in magnetic field adjustment of magnets.

BRIEF SUMMARY OF THE INVENTION

In order to achieve the above-described objective, the present invention provides the method, with respect to a static magnetic field generated in a measurement space by a static magnetic field generation unit, that adjusts the homogeneity of the static magnetic field by a placing magnetic field correction unit configured to generate a corrected magnetic field, including:

measuring a static magnetic field generated by static magnetic field generation unit;

expanding the spatial distribution of the measured static magnetic field in a series;

a first magnetic field adjustment for correcting irregular magnetic field components of high-order terms from among the irregular magnetic field components that are expanded in a series; and a second magnetic field adjustment for adjusting irregular magnetic field components of low-order terms, which follows after execution of the first adjustment.

Effect of the Invention

In accordance with the present invention, by adjusting irregular magnetic field of high-order terms in a first magnetic field adjustment and adjusting irregular magnetic field of low-order terms in a second magnetic field adjustment, only the irregular magnetic field caused by the environment needs to be primarily adjusted in the second magnetic field without repeating the adjustment of terms of series that overlap between the magnetic field inhomogeneity in the magnetic itself and the magnetic field inhomogeneity due to the environment, whereby reducing the entire process of the magnetic field adjustment. Also, intended static magnetic field homogeneity can be achieved while the consumption of man-hour and helium are reduced at the time of magnetic field adjustment in the final installation site of a static magnetic field generation device.

The present invention also comprises magnetic field correction units for correcting irregular magnetic field of low-order terms and magnetic field correction units for correcting irregular magnetic field of high-order term separately, thus there is no need to transfer or change the magnetic field correction units after irregular magnetic field of high-order terms are corrected, thereby significantly improving the workability of magnetic field generation device at the time of correcting irregular magnetic field of low-order terms.

BRIEF DESCRIPTION OF THE DRAWINGS

FIG. 3 show the magnetic field distribution of a superconducting magnet, in which (a) shows the distribution of a static magnetic field before the adjustment, (b) shows the magnetic field distribution after completing a first magnetic field adjustment, and (c) shows the magnetic field distribution after completing a second magnetic field adjustment.

FIG. 16 is a display example of the calculation result of the magnetic field adjustment system in the first magnetic field adjustment.

FIG. 17 is a display example of the calculation result of the magnetic field adjustment system in the first magnetic field adjustment.

FIG. 18 is a display example of the calculation result in the magnetic field adjustment system in a second magnetic field adjustment.

FIG. 19 is a display example of the calculation result in the magnetic field adjustment system in the second magnetic field adjustment.

DETAILED DESCRIPTION OF THE INVENTION

An embodiment of the magnetic field adjustment method in a static magnetic field generation device related to the present invention will be described below referring to the attached drawings. The measures such as the size, number and magnetic field intensity are examples, thus the present invention is not limited to the numerical values described in the embodiment.

First, the process of developing the present invention will be described.

In concrete terms, the present inventor conducted in-depth examination of the property of irregular magnetic field due to the environmental magnetic field. As a result, the inventor found out that the adjustment of irregular magnetic field due to the environmental magnetic field can be accomplished by mainly adjusting the magnetic field components of low-order terms, which lead to the development of the present invention.

The irregular magnetic field caused by the environmental magnetic field is generated in an imaging space of primarily a superconducting magnet, when a ferromagnetic body in the vicinity of the superconducting magnet is magnetized due to the magnetic field leakage from the superconducting magnet.

In a space in which a magnet is placed, a ferromagnetic body in the vicinity of the magnet is to be placed at the position which is apart from the magnet by a predetermined distance. For example, in a case that a cylindrical magnet with 1 m of the central magnetic field height, 2 m of the diameter and 1.6 m of the axis length is used, the ferromagnetic body to be placed at the nearest position from the magnet is installed on the floor or inside of the side wall, thus the ferromagnetic body is to be placed, considering the thickness of the structure (for example, reinforcing structure made from wood or concrete), where is apart from the magnet by at least about 1.2 m.

Figure 1:
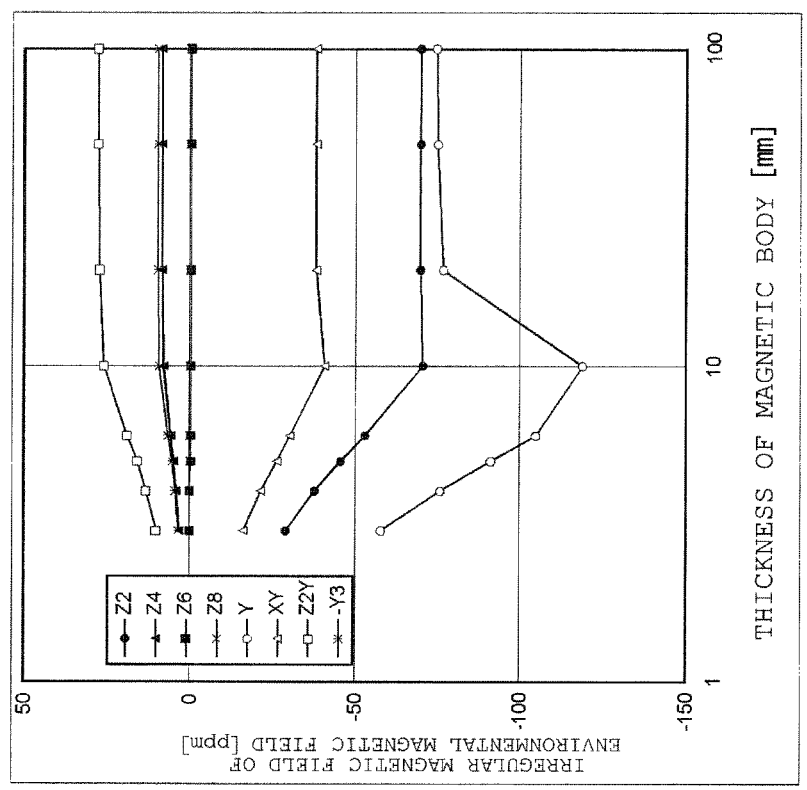
FIG. 1 shows the relationship between an irregular magnetic field due to the environmental magnetic field and the thickness of a magnetic body.

As a result in which a ferromagnetic body placed at a position which is about 1.2 m apart from a superconducting magnet is magnetized due to the magnetic field leakage, the irregular magnetic field components generated in the central magnetic field space are as shown in FIG. 1. FIG. 1 shows the values in which the respective components of the irregular magnetic field (Z2, Z4, Z6, Z8, Y, XY, Z2Y and −Y3) are obtained by simulation, which indicate the relationship between the magnitude of irregular magnetic field (ppm) and the thickness of a magnetic body. As shown in the diagram, the irregular magnetic field components having the order higher than the fourth-order are extremely small. Also, while the respective irregular magnetic field components have a tendency to increase as the amount of material (thickness) of the ferromagnetic body on the outside of a superconducting magnet increases, when the thickness surpasses a certain value (about 10 mm here), the magnitude of each irregular magnetic field is saturated or has its extreme value and maintains a certain value.

This is considered because, while the ferromagnetic body is approximately saturated in the region which is short of the thickness of thereof (less than 10 mm) and the density of magnetic flux tends to increase as the thickness increases, when the ferromagnetic body has substantial thickness and the magnetization thereof no longer is saturated, since the outside magnetic field at the position of the ferromagnetic body (the amount of magnetic field leakage) is constant, the magnetic field amount generated at the center of magnetic field of the superconducting magnetic becomes closer to the constant amount when the thickness surpasses a certain measure.

On the other hand, the respective irregular magnetic field components generated by a ferromagnetic body have the characteristic that attenuates at each power of the order of the distance between the magnet and the ferromagnetic body. For this reason, the higher the order term becomes the high-order term of the superconducting magnet attenuates, then becomes almost zero at the center of the magnetic field space. In the case in which the central magnet field intensity is 1.5 tesla and the 5 gauss line is about 4~5 m in the axis direction and about 2~3 m in the diameter direction, the irregular magnetic field components generated in the central magnetic field by the ferromagnetic body placed about 1.2 m apart from the magnet becomes the fourth-order term or lower.

From the above-described analysis, we find that the amount and the order of the irregular magnetic field due to the environmental magnetic field becomes lower than a certain constraint value, in the condition that the thickness of a ferromagnetic body placed in the vicinity of a superconducting magnet is more than a certain value. Next, a technique to be the premise of the present invention will be described.

<Static Magnetic Field Adjustment Method>

In the present embodiment, a static magnetic field adjustment method in a static magnetic field generation device of which the cylindrical static magnetic field direction is parallel with the axis of the cylinder.

Figure 2:
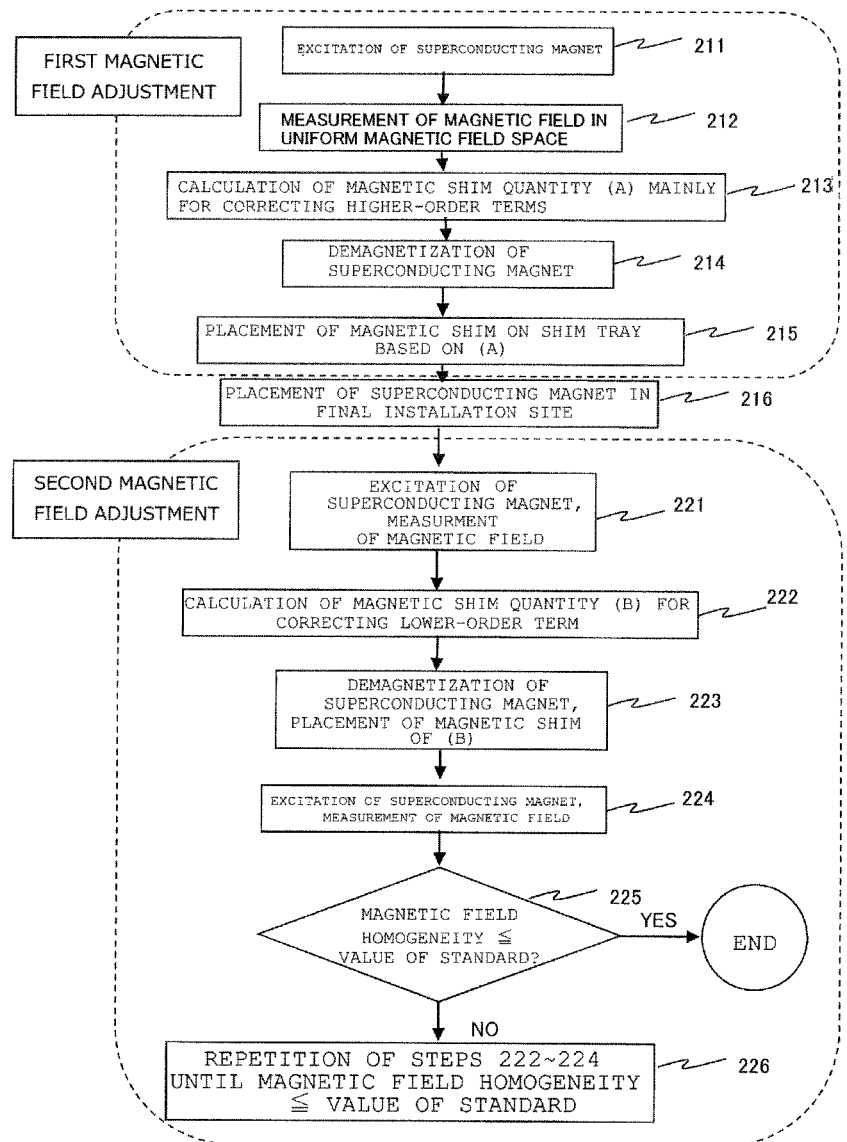
FIG. 2 shows the procedure of the magnetic field adjustment method by the present invention.

The procedure of the static magnetic field adjustment method is shown in FIG. 2. The static magnetic field adjustment method of the present embodiment includes two stages of magnetic field adjustment steps that place magnetic field correction units along plural lines which are parallel with the axis of the cylinder and are on a virtual cylinder which shares the same center as the cylinder. A first magnetic field adjustment step 210 mainly adjusts the irregular magnetic field of high-orders, and a second magnetic field adjustment step 220 mainly adjusts the irregular magnetic field of low-orders, A step of moving the static magnetic field generation device may also be included between the first magnetic field adjustment step 210 and the second adjustment step 220.

First, the magnetic field adjustment step 210 will be described. The first magnetic field adjustment step is to be executed before a superconducting magnet is placed at the final installation site of the MRI apparatus (for example, before shipment).

<<Step 211>>

A superconducting magnet is excited.

<<Step 212>>

The magnetic field distribution in the space in which the homogeneity of the magnet is required, i.e. in the measurement space of an MRI apparatus is measured. The magnetic field measurement is performed using a magnetic field adjustment system provided with a magnetic field measuring probe and a computing machine to be described later. The magnetic field distribution in the static magnetic field space is measured by positioning the magnetic field measuring probe in the static magnetic field space and detecting the magnetic field while moving the probe along a predetermined trajectory. In an MRI apparatus having the central magnetic field intensity of 1.5 tesla, several tens ppm of the peak-to-peak value of the static magnetic field homogeneity is required in a space of 45~50 cm diameter. This space with 45~50 cm diameter is the target homogeneous space for the magnetic field measurement.

However, it is difficult to obtain the required homogeneity due to dimension errors in fabrication of superconducting magnets, thus the actual dimension turns out to be several hundreds of ppm. The magnet field distribution of the magnet prior to adjustment is shown in FIG. 3(a).

The diagram shows the Z-R cross-section in a case that the central magnetic field direction of a cylindrical magnet is set as Z and the radius direction is set as R, and the magnetic field distribution is represented by contour lines. In the diagram, the circle denoted by a dotted line is a cross-section of 40 cmDSV.

Next, the magnetic field distribution which is the measurement result by the magnetic field measuring probe is input, and the magnetic field components are expanded into the order components by the spherical surface harmonics. The expanded order components are expressed by the following equation (1).

[Equation 1]

$$Bz = B0 + Za(1, 0) + Za(2, 0) + Za(3, 0) + Za(4, 0) + \ldots + Za(\alpha, 0) + \ldots + Za(\beta, 0) + \ldots + Za(N, 0) + Za(1, 1) + Zb(1, 1) + Za(2, 1) + Za(2, 2) + Zb(2, 1) + Zb(2, 2) + Za(3, 1) + Za(3, 2) + Za(3, 3) + Zb(3, 1) + Zb(3, 2) + Zb(3, 3) + \ldots + Za(N, M) + Zb(N, M) \quad (1)$$

In the equation, $Za(N,M)$ is the A-term and $Zb(N,M)$ is the B-term by the spherical surface harmonics. Also, $B0$ is an invariable magnetic field intensity, and $Za(\alpha,0)$ and $Za(\beta,0)$ (in this regard, however $\alpha<\beta$) is an inherent terms of series of the magnet (referred to as design terms of series) attribute to the magnetomotive source (the number of concentric coils). The objective of the magnet field adjustment is to ultimately bring $Za(\alpha,0)$ and $Za(\beta,0)$ close to a desired design value and to bring all terms of series that are less than $\alpha$-th order close to zero.

<<Step 213>>

In the first adjustment step, mainly the irregular magnetic field including the high-order terms is corrected from among these order components. Accordingly, shim quantity (A) for correcting the irregular magnetic field including the order terms higher than the N-th order term is calculated from among the order components expressed by the equation (1). As for the shim quantity, in a case that the magnetic field correction units is a magnetic shim, the number and the placement position of the shim irons to be placed in a predetermined shim tray (the shim tray for the first magnetic field adjustment) is calculated. For example, N is set as 4. Using the optimization method such as the linear programming, the position of the shim iron of which the square of the difference between the irregular magnetic field of $N(>4)$-th order and the shim quantity by the shim iron placed at a predetermined position in the shim tray becomes the minimum is obtained.

Though it is preferable at this time to ignore the magnetic field components of the order which is N=4 and below in the magnetic field adjustment, since the second-order term and the fourth-order term are the terms of series correlated as well with the sixth-order term or the eighth-order term and the magnetic body shim quantity necessary for the adjustment often becomes excessive when such components are completely ignored, some adjustment may be performed.

Figure 4:
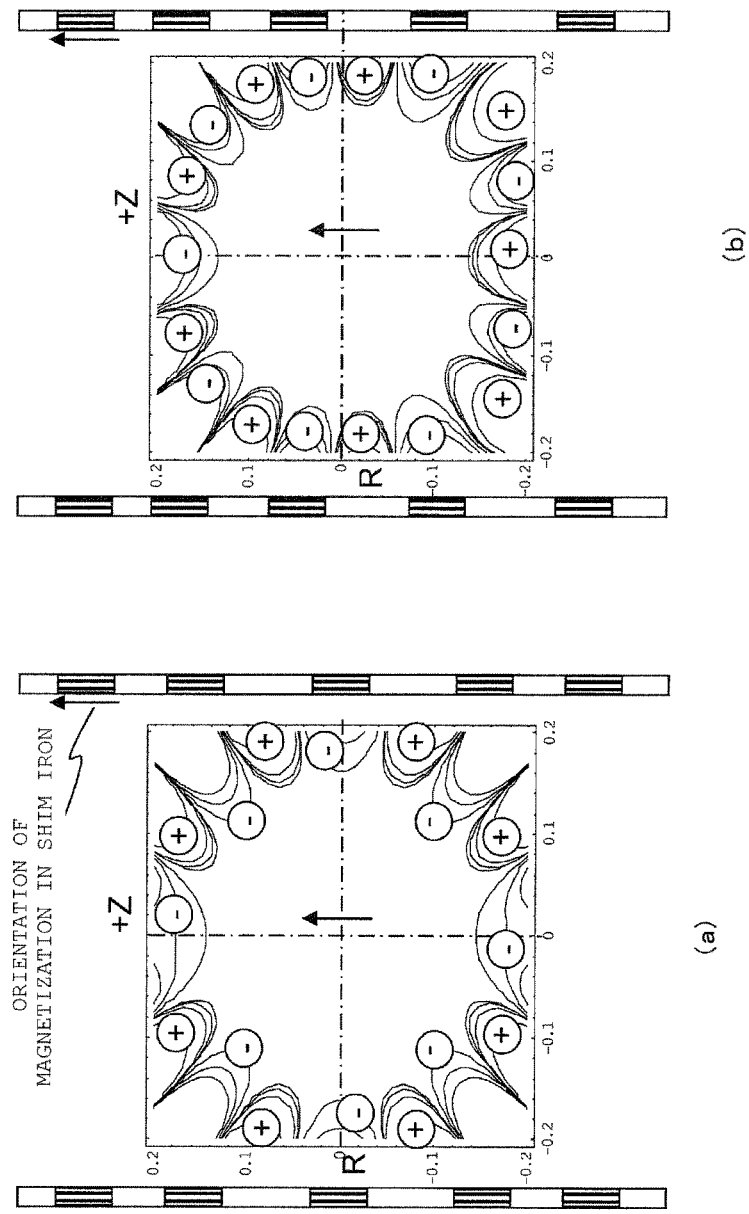
FIG. 4 show a concrete placement example of shim irons in the first magnetic field adjustment, in which (a) shows an example of irregular magnetic field of the eighth-order term and the correction thereof and (b) shows an example of irregular magnetic field of the ninth-order term and the correction thereof.

Concrete examples of the shim iron placement position in cases that the N-th order is 8 and 9 are shown in FIG. 4. FIG. 4(a) is the case that N is 8, and FIG. 4(b) is the case that N is 9. Both drawings show the Z-R cross-section in which the central magnetic field direction of the cylindrical magnet is set as Z, the radial direction is set as R, and the magnetic field distribution is expressed by contour lines. In display of the contour lines, the regions having a high magnetic field (Bz) are denoted by (+) and the regions having a low magnetic field are denoted by (−). Also, the arrow in the center indicates the orientation of a static magnetic field (B0) and the arrow on the right side indicates the orientation of magnetization in the shim irons (the same hereinafter in FIG. 5).

As shown in FIG. 4, the (−) regions due to irregular magnetic field exist axisymmetically in the Z-axis direction, the (+) and (−) regions exist discretely and respectively in the Z-axis direction in the irregular magnetic field including the eighth-order and ninth-order terms, and there are five (−) regions. Assuming that the direction of magnetization in the shim irons is the (+) direction, the number and the positions of the shim irons for correcting the above-mentioned irregular magnetic field correspond to the number and the positions of the respectively existing (−) regions, thus are five discrete positions in the Z-direction. While a cylindrical cross-section is shown in the diagram, the placement region of a shim is cylindrically-shaped, concentric and toric region.

Further, though not shown in the diagram, there are six (−) regions in the irregular magnetic field of the 10-th (N=10) order term, thus there are at least six regions of shim-iron placement regions. In principle, the places of the shim placement regions increase as the order of the irregular magnetic field increases.

<<Step 214>>

The superconducting magnet is demagnetized.

<<Step 215>>

In accordance with the result of calculation performed in step 213, the shim irons are placed at predetermined positions in a shim tray and set in the superconducting magnet. In this condition, the first magnetic field adjustment step 210 is completed. The magnetic field distribution at the point of completing the first magnetic field adjustment step 210 is shown in FIG. 3(b). As may be observed in comparison with the magnetic field distribution of the magnet prior to the adjustment shown in FIG. 3(a), mainly the high-order terms are adjusted and the low-order terms remain when the first magnetic field adjustment step is completed.

<<Step 216>>

The superconducting magnet is moved to the final installation site, and the second magnetic field adjustment 220 is carried out.

<<Step 221>>

The superconducting magnet is excited, and the magnetic field distribution in the space in which the homogeneity of the magnet is required is measured using the magnetic field measuring probe as in step 212 of the first magnetic field adjustment. In the installation site, the irregular magnetic fields due to the environmental magnetic field are generated as described above, and are of mainly the low-order components.

$Za(1,1), Zb(1,1)$ $Za(2,1), Za(2,2), Zb(2,1), Zb(2,2)$ $Za(3,1), Za(3,2), Za(3,3), Zb(3,1), Zb(3,2), Zb(3,3)$ $Za(4,1), Za(4,2), Za(4,3), Za(4,4), Zb(4,1), Zb(4,2), Zb(4,3),$ $Zb(4,4)$

<<Step 222>>

The magnetic field components are expanded in a series using the magnetic field distribution measured by the magnetic field measuring probe, and the shim quantity (B) for correcting the irregular magnetic field of the N(=4)-th order and below is calculated. Here, if the magnetic field correction units is a magnetic shim, the positions and the number of the shim irons in the shim tray for demagnetizing the irregular magnetic field of the N-th order term is also calculated by the optimization method.

Concrete examples of the positions for placing shim irons in the case that the N-th order is 1~4 are shown in FIG. 5(a)~(d). The diagrams show the Z-R cross-section in a case that the central magnetic field direction of a cylindrically-shaped magnet is set as Z and the radial direction is set as R, and the magnetic field distribution is expressed by contour lines. Also, the regions at which the shim irons are placed are generally distributed evenly and discretely in the R-direction, centering around the Z-axis. In FIGS. 5(a)~(d), only one row (one strip of shim tray) is indicated as a representative. As shown in FIG. 5, one (−) region exists in the irregular magnetic field including the first-order term of a series. Two (−) regions exist in the irregular magnetic field including the second-order and third-order terms of a series, and three (−) regions exist in the irregular magnetic field including the fourth-order terms of a series. The number and the positions of the shim irons for correcting these irregular magnetic fields correspond to the number and the positions of the respectively existing (−) regions, which are at both ends (+Z side and −Z side) and the central area in the space.

<<Step 223>>

The superconducting magnet is demagnetized, and the shim irons are placed in a shim tray (a shim tray for the second magnetic field adjustment) in accordance with the calculation result of step 221, and set in the superconducting magnet.

<<Step 224>>

The superconducting magnet is excited again, and the magnetic field distribution in the space within the magnet is measured using the magnetic field measuring probe as in step 221.

<<Steps 225 and 226>>

Whether the measured magnetic field homogeneity is the previously set value of standard or lower is determined, and the adjustment is ended if the homogeneity is the value of standard or lower. If the homogeneity is greater than the value of standard, steps 222~224 are repeated until the measured magnetic field homogeneity becomes the value of standard or lower. The magnetic field distribution at the time that the second magnetic field adjustment step 220 is completed is shown in FIG. 3(c). As shown in the diagram, only the residual design magnetic field ultimately becomes the static magnetic field of remained high homogeneity.

As described above, in accordance with the magnetic field adjustment method of the present embodiment, by adjusting mainly the irregular magnetic field components of high-orders in the first magnetic field adjustment step and adjusting the irregular magnetic field of low-orders in the second magnetic field adjustment to be performed at the installation site, it is possible to drastically reduce the time necessary for magnetic field adjustment at the installation site as well as providing a static magnetic field generation device for generating static magnetic fields with high homogeneity in which the irregular magnetic field components of high-orders are also corrected. Also, since the irregular magnetic field components of low-orders are adjusted in the installation site and the homogeneity can be attained by repeating comparatively short steps, the repetition of excitation and demagnetization of the magnet can be reduced and the consumption of liquid helium can be suppressed.

Figure 6:
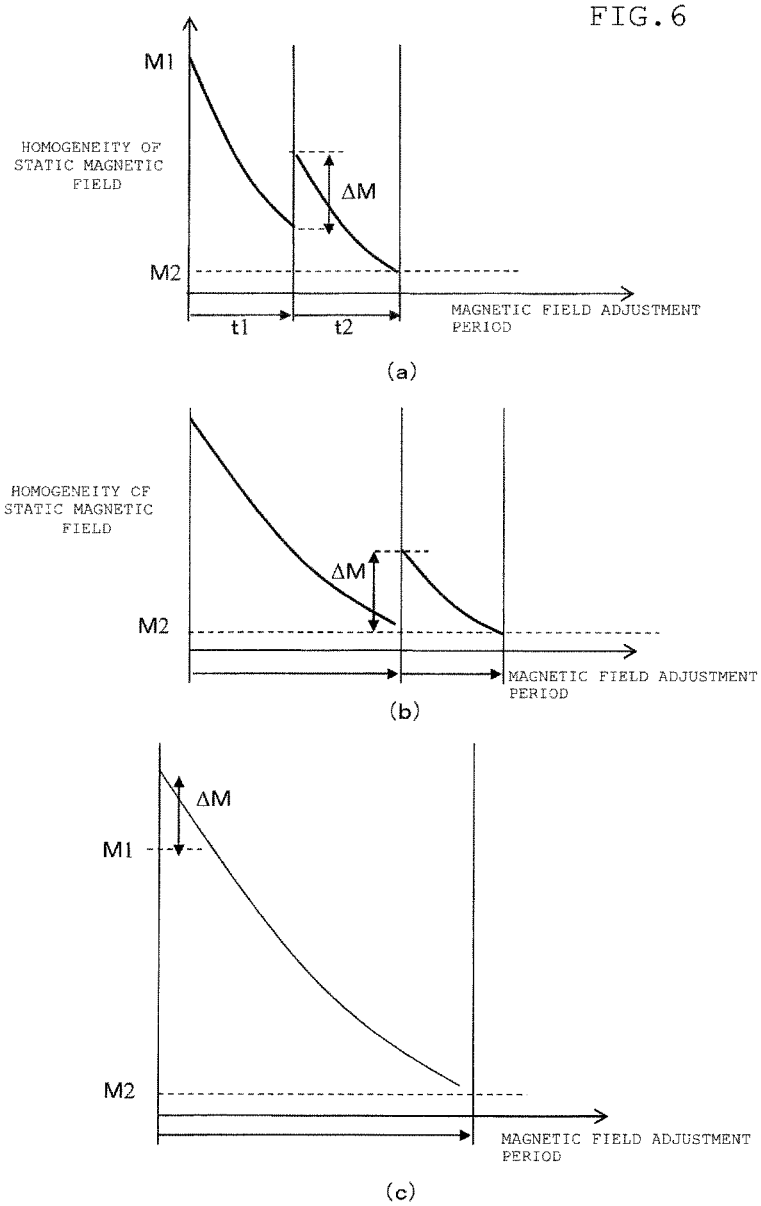
FIG. 6 show the transition of static magnetic field homogeneity at the time of magnetic field adjustment by the method of the present invention and the conventional method, in which (a) shows a graph showing the transition of static magnetic field inhomogeneity at the time of magnetic field adjustment by the present invention, (b) is a graph showing the transition of static magnetic field homogeneity by conventional technique 1, and (c) is a graph showing the transition of static magnetic field homogeneity by conventional technique 2.

The comparison between the adjustment time by the magnetic field adjustment method of the present embodiment and the adjustment time of the conventional magnetic field adjustment method is shown in FIGS. 6(a)~(c). FIGS. 6(a)~(c) show the graphs indicating the transition of magnetic field homogeneity from the start of the adjustment to the end of adjustment at the installation site, wherein (a) shows the case of the present embodiment and (b) and (c) show the conventional method (for example, the methods disclosed in Patent Documents 2 and 3). In the diagram, M1 indicates the homogeneity of the magnetic field prior to the adjustment, M2 indicates the required homogeneity (value of standard), and MΔ indicates the magnetic field degradation due to the irregular magnetic field caused by the environment.

In the present embodiment (FIG. 6(a)), though the magnetic field homogeneity at the time of completing the first step is not very high since mainly the high-order components are adjusted in the first magnetic field adjustment, the time required for the adjustment (t1) is short. Also in the second embodiment, only the low-order components are adjusted, thus high homogeneity can be attained ultimately in a short period time (t2). In contrast to this, in a case in which a sufficient adjustment is performed in the first step for reducing the adjustment time in the second step (FIG. 6(b)), the time required for the adjustment in the first step is prolonged, which results in a prolonged adjustment time of the entire procedure. Also in a case in which the adjustment of static magnetic field homogeneity of a magnet and the adjustment of the irregular magnetic field due to the environment are performed at once at the final installation site in order to avoid two times of adjustment process (FIG. 6(c)), the time required for the adjustment at the installation site can be extremely prolonged even over a few days.

While a case in which the irregular magnetic fields of high-order terms that are higher than the fifth-order are corrected in the first magnetic field adjustment step has been explained in the above-described embodiment, the order which separates the first step and the second step is not limited in the example of the above-described embodiment. Also, while the case in which mainly the irregular magnetic field of high orders are corrected in the first step in the magnetic field adjustment method of the present invention has been described in the above-described embodiment, the magnetic field adjustment may be performed by correcting also the low-order terms to a certain extent in the first step and adjusting the remained irregular magnetic field of low orders in the second magnetic field adjustment step until a desired static magnetic field is attained, whereby further reducing the entire magnetic field adjustment time.

The intension of the magnetic field adjustment method related to the present invention is to correct mainly the irregular magnetic field of high orders in the first step and to correct the irregular magnetic field of low orders in the second step, wherein different magnetic field correction units can also be used in the first and the second magnetic field adjustment. For example, while a shim tray is used in the first magnetic field adjustment, a magnetic shim member movable to the periphery of a magnet or magnetic field correction unit by electric current can also be used in the second magnetic field adjustment. In this case, demagnetization of a superconducting magnet is not necessary in the second magnetic field adjustment, thus the time, workload and cost can be reduced.

<Static Magnetic Field Generation Device>

Next, a preferable static magnetic field generation device for the magnetic field adjustment method of the above-described present embodiment, in particular to the configuration of the magnetic field correction unit will be described.

<Embodiment 1>

As an embodiment of a static magnetic field generation device of the present invention, a cylindrically-shaped static magnetic field generation device preferable for an MRI apparatus of the horizontal magnetic field method will be described.

Figure 7:
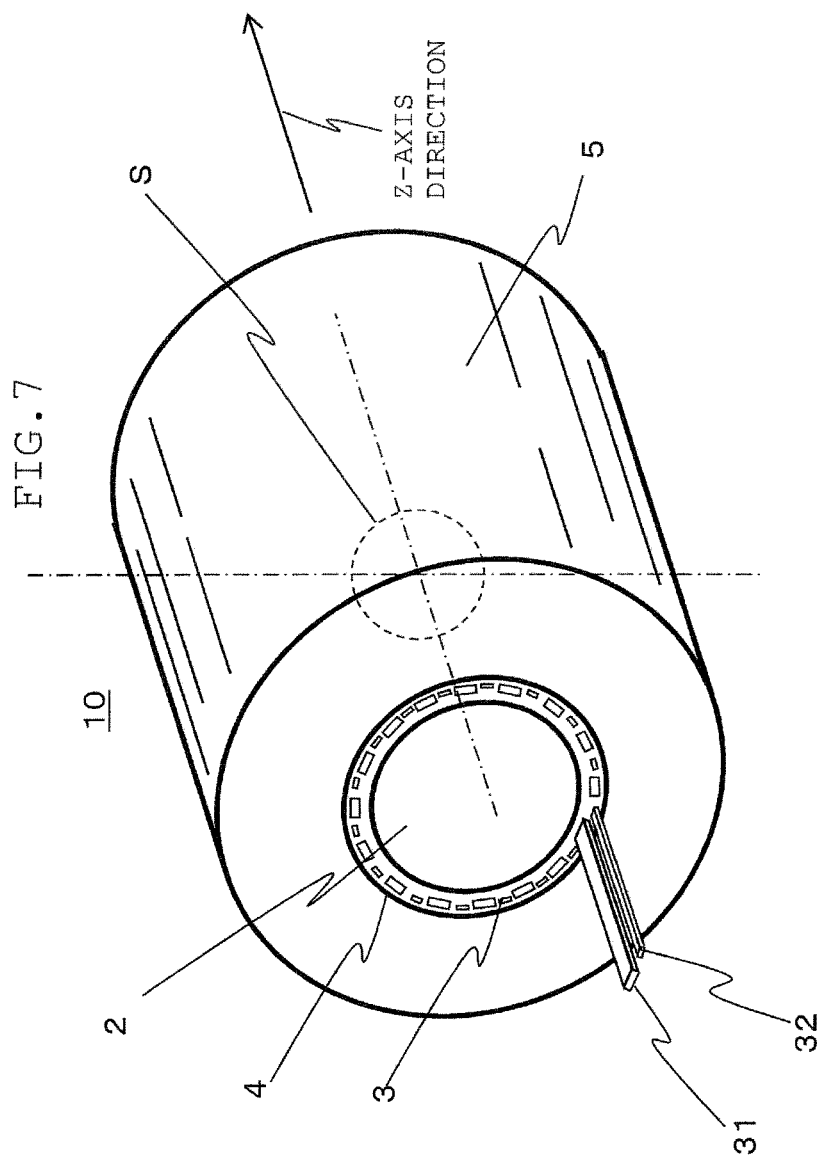
FIG. 7 shows the outline of a cylindrical static magnetic field generation device in Embodiment 1.

FIG. 7 shows an example of a cylindrically-shaped static magnetic field generation device. A static magnetic field generation device 10 shown in the diagram is formed by a cylindrical magnet 1 and a shim tray storage portion 3 to be placed along the inner wall surface of a cylindrical bore in the magnet 1. The superconducting magnet 1 is formed by a superconducting coil of solenoid-type which is not shown in the diagram and a vacuum case 5 for storing the superconducting coil, and approximately spherical and homogeneous magnetic field space S is formed inside of the cylindrical bore 2. This magnetic field space S is the imaging space in the MRI apparatus in which an examination target is placed.

When the static magnetic field generation 10 is used for an MRI apparatus, a gradient magnetic field coil 4 is placed in the inner wall of the cylindrical bore 2. In this case, the shim tray storage portion 3 can be installed inside of the gradient magnetic field coil 4 or between the gradient magnetic field coil 4 and the inner-wall surface of the cylindrical bore 2. In either case, the shim tray storage portion 3 is cylindrically-shaped along the inner-wall surface of the cylindrical bore 2, and a long and thin storage portion is formed for storing plural shim trays in the axis direction of the cylinder.

Figure 8:
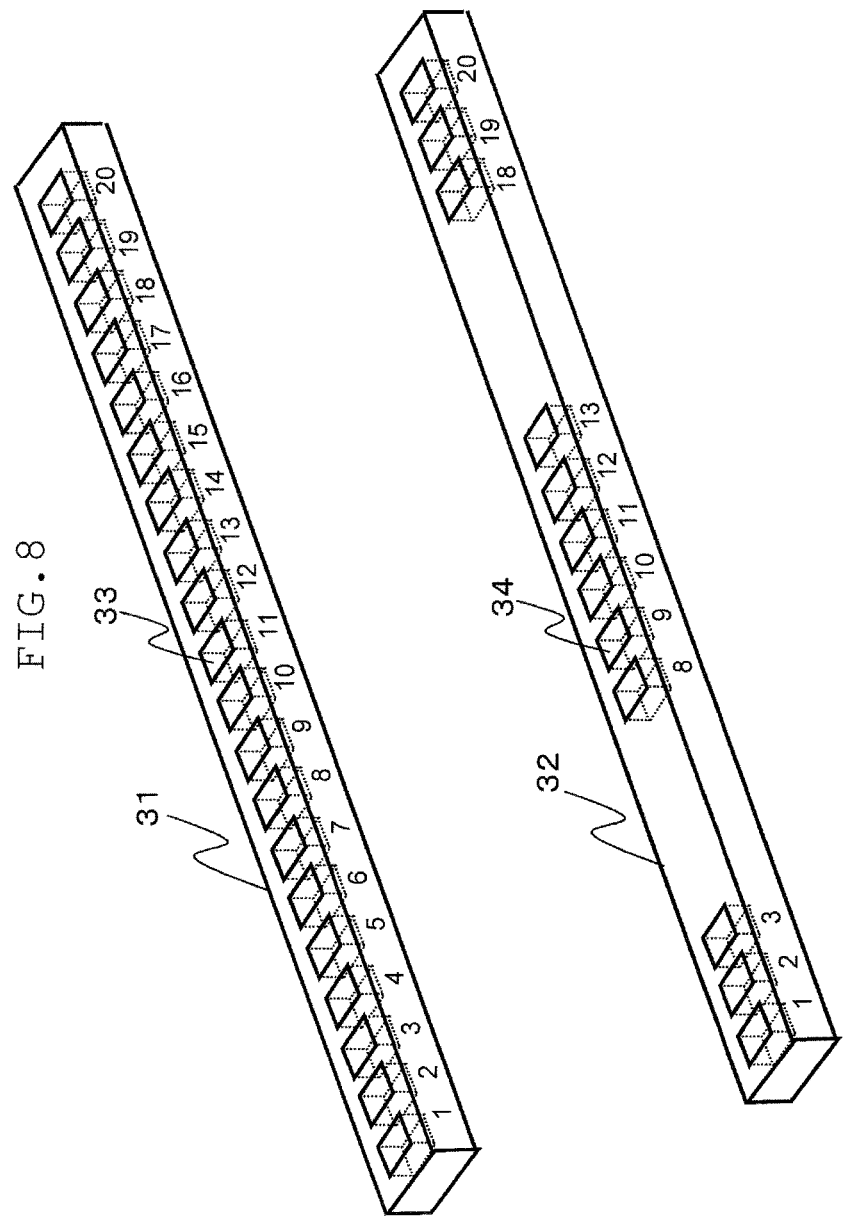
FIG. 8 is an example of magnetic field correction units of the static magnetic field generation device in FIG. 7.

The shim tray is for adjusting the irregular magnetic field included in a static magnetic field in space S to raise the homogeneity of the static magnetic field, and pockets for storing multiple magnetic body pieces are formed therein. The shim irons are generally used as the magnetic body pieces, thus the shim irons will be described in the following explanation. In the present embodiment, two kinds of shim trays, a first shim tray 31 and a second shim tray 32, correlating to the magnetic field adjustment steps are comprised as shown in FIG. 8. These two kinds of shim trays 31 and 32 are long and thin rod-shaped members, and plural pockets 33 and 34 are formed for storing the shim irons along the longitudinal direction.

In the shim tray storage portion 3 (FIG. 7), storage portions corresponding to the two kinds of shim trays are formed, so that the two kinds of shim trays 31 and 32 are ultimately placed in the circumferential direction. The shim trays 31 and 32 can be inserted into and pulled out from the storage portions, and when pockets 33 and 34 for storing shim irons are determined for each shim tray by the previously described magnetic field adjustment method, the shim irons are stored in the given pockets of the respective shim trays 31 and 32 then the respective shim trays 31 and 32 are inserted into the storage portions.

The first shim tray 31 is, when the magnetic field distribution is expanded in a series by the spherical surface harmonics, for adjusting the irregular magnetic field corresponding to mainly the magnetic field components of high orders, and 20 pockets 33 are provided across the longitudinal direction in approximately even sequence in the example of the diagram. By such arrangement of pockets in the first shim tray 31, the irregular magnetic field of high orders in which (+) and (−) ultimately appear in the Z-direction as shown in FIG. 4 can be adjusted.

For example, in a case in which the irregular magnetic field including the eighth-order term in a series shown in FIG. 4(a) is corrected, the shim irons need to be placed in five regions, and in the shim tray 31 provided with 20 pockets shown in FIG. 8, the shim irons are discretely arranged in five regions of pockets 1 and 2, pockets 5 and 6, pockets 10 and 11, pocket 15 and 16, and pocket 19 and 20. In principle, the places for shim placement regions increase as the order of the irregular magnetic field increases, and since the respective shim placement regions are arranged discretely, the necessary number of pockets per a shim tray would be about 20 considering the correction of magnetic field of high orders, depending on the magnetic field property of a superconducting magnet before the adjustment.

Figure 5:
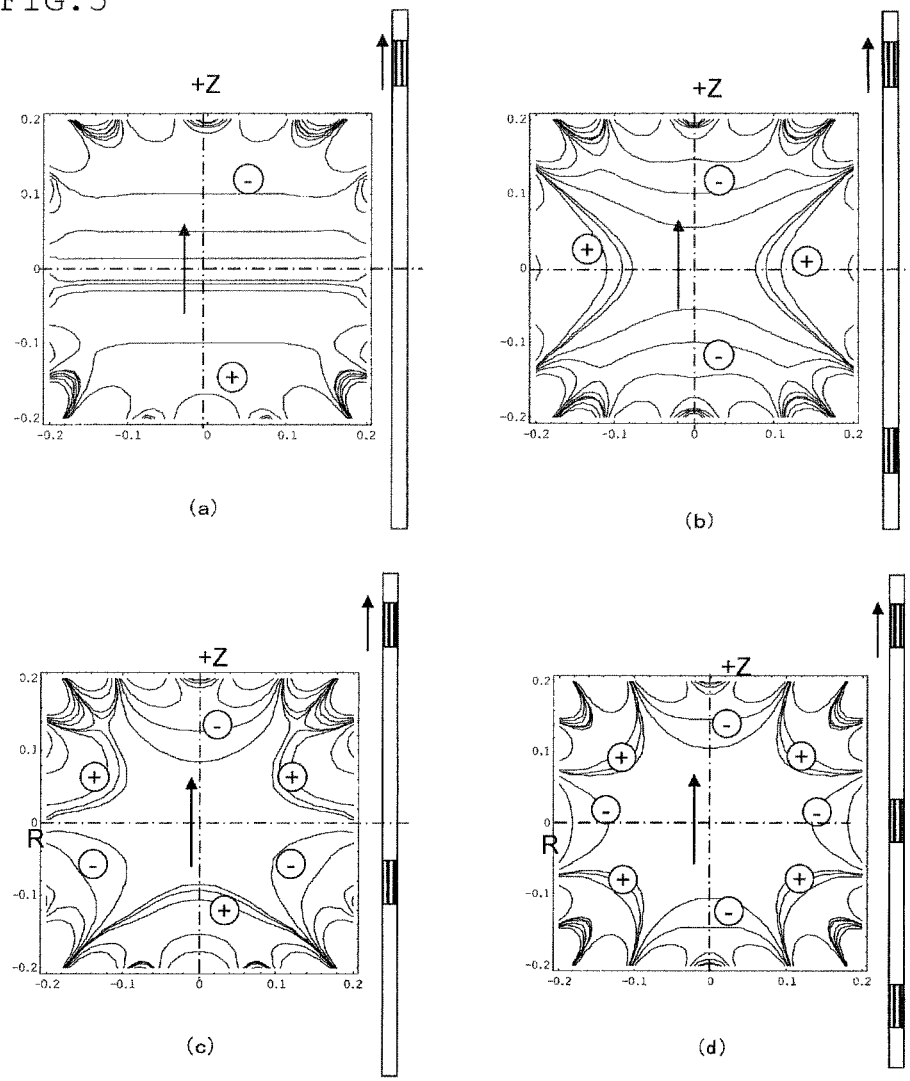
FIG. 5 shows a concrete placement example of shim irons in the first magnetic field, in which (a) shows an example of irregular magnetic field of the first-order term and the correction thereof, (b) shows an example of irregular magnetic field of the second-order term and the correction thereof, (c) shows an example of irregular magnetic field of the third-order term, and (d) shows an example of irregular magnetic field of the fourth-order term and the correction thereof.

The second shim tray 32 is for mainly adjusting the irregular magnetic field corresponding to the magnetic field components of low orders, and pockets 34 are dispositionately provided in the central portion and both end portions in the longitudinal direction, and there are regions provided with no pockets between the central portion and the end portions. In the example shown in FIG. 8, the shim tray 32 is provided with three pockets in each end portion and six pockets in the central portion. Therefore, the first shim tray is provided with the storage portions arranged evenly across the longitudinal direction, and the second shim tray has both the regions provided with and without the storage portions in the longitudinal direction. Then the static magnetic field generation unit has approximately cylindrical shape, and the shim trays has rod-like shape and are placed in the cylinder of the static magnetic field generation unit along the axis direction. As shown in FIG. 5, the region of (−) appears in the both ends in the Z-axis direction with respect to the center of the magnetic field in the irregular magnetic field of the first-order and the second-order of terms, and the region of (−) appears in the ends and the central portion in the Z-axis direction with respect to the center of the magnetic field in the irregular magnetic field of the third-order and the fourth-order of terms. Therefore, these irregular magnetic fields of low orders can be adjusted by placing the pockets in the above-described second shim trays 32.

For correcting the above-described magnetic field including high-order terms and low-order terms, it is preferable that the shim iron placement regions are arranged in concentric and circular patterns. In the placement of shim trays of the present embodiment, the shim trays 31 to be used for the first magnetic field adjustment and the shim trays 32 to be used for the second magnetic field adjustment are placed almost evenly along the circumferential direction without eccentric alignment, thus the correction of the magnetic field can be achieved without uneven performance of magnetic field adjustment in the circumferential direction and the axis direction in the respective adjustment steps.

The static magnetic field generation device of the present embodiment has a configuration in which different kinds of shim trays are alternately placed, thereby making it possible to adjust the magnetic fields by using different shim trays in accordance with the order of the irregular magnetic field components. Also, since the adjustment can be carried out using only the shim trays 32 for the second magnetic field adjustment step while the shim trays 31 with heavy weight due to the placement of shim irons in the first magnetic field adjustment step are being fixed, the workload for the adjustment can be drastically reduced. Also, since the difference in two kinds of shim trays can be easily recognized, two kinds of shim trays can be used for different objectives appropriately, whereby preventing misuse of the shim trays.

<Modification 1>

While a case of FIG. 8 has been described in which the same shape of shim trays are used in the shim trays 31 and 32 except the positions and the number thereof, it is also possible to differentiate the shapes in accordance with the kind of shim trays. The embodiment using shim trays with different shapes is shown in FIG. 9.

Figure 9:
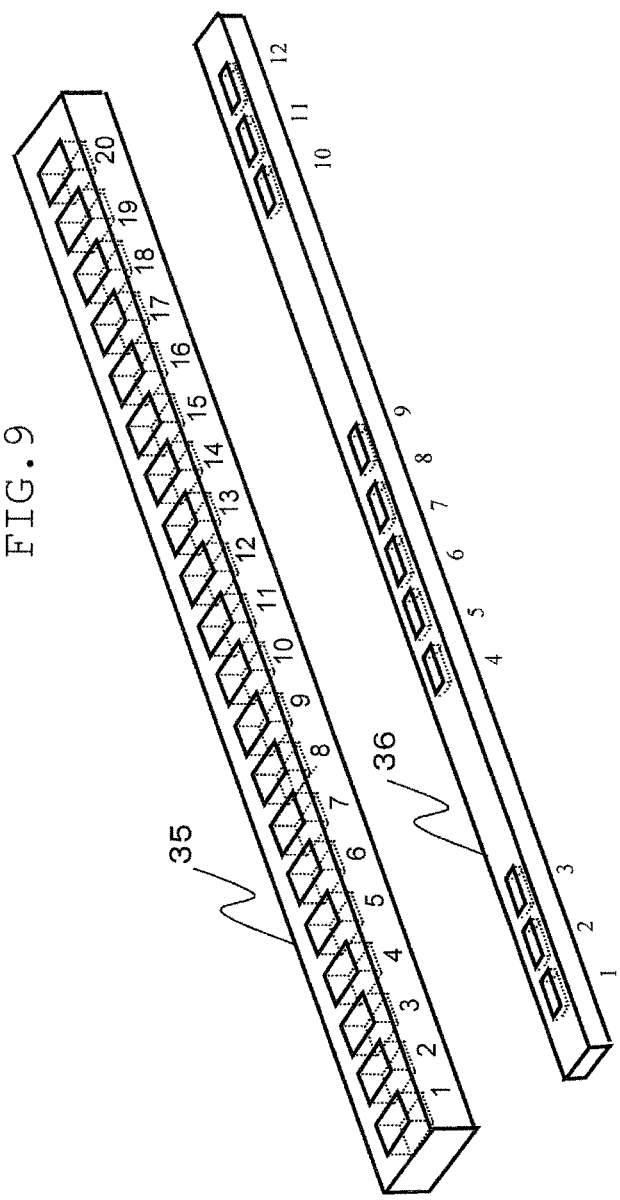
FIG. 9 is a modification example of the magnetic field correction units in FIG. 8.

The shim trays shown in FIG. 9 are the same as the shim trays shown in FIG. 8 in that they are formed by first and second shim trays 35 and 36, and that the first shim tray 35 is provided with pockets evenly arranged in the longitudinal direction and the second shim tray 36 is provided with pockets only in both end portions and the central portion of the longitudinal direction. In the shim trays shown in FIG. 9, the second shim tray 36 is smaller than the first shim tray 35 in the area of the cross-section orthogonal to the longitudinal direction, and the size of the pockets as well as the magnetic force of the shim irons to be stored in the pockets are also smaller. Corresponding to the size of these two kinds of shim trays, the shape of the shim tray storage portions 3 (FIG. 7) to be provided along the inner wall surface of the cylindrical bore are differentiated. The number and/or the size between the magnetic body pieces to be stored in the first shim tray and the magnetic body pieces to be stored in the second shim tray are also differentiated.

These shim trays in Modification 1 are preferable for a case in which the magnetic field adjustment method is applied wherein not only the irregular magnetic field of high orders but also of low orders is corrected to some extent in the first magnetic field adjustment step and the remaining irregular magnetic field of low orders is corrected in the second magnetic field adjustment method. In this case, since there is no need to place a large number of shim irons in the second magnetic field adjustment step, the size and the depth of the respective pockets in the second shim trays 36 can be made sufficiently smaller and shallower than those of the first shim trays 35. The shim iron placement regions in the shim trays 36 can be placed roughly in both end portions and the central portions in the longitudinal direction as in the shim trays 32 shown in FIG. 8.

In accordance with the present embodiment, the second shim trays are light in weight, thus can be inserted into and taken out of the storage portions at the time of performing the adjustment using the second shim trays after the first adjustment step using the first shim trays, whereby further reducing the workload for making the adjustment. Also, the electromagnetic attractive force which acts on the shim irons in the magnetic field becomes small depending on the extent of weight saving and the number of shim irons to be placed, thus the shim irons can be moved while the superconducting magnet is excited, whereby reducing the liquid helium consumption and the man hours.

<Modification 2>

Figure 10:
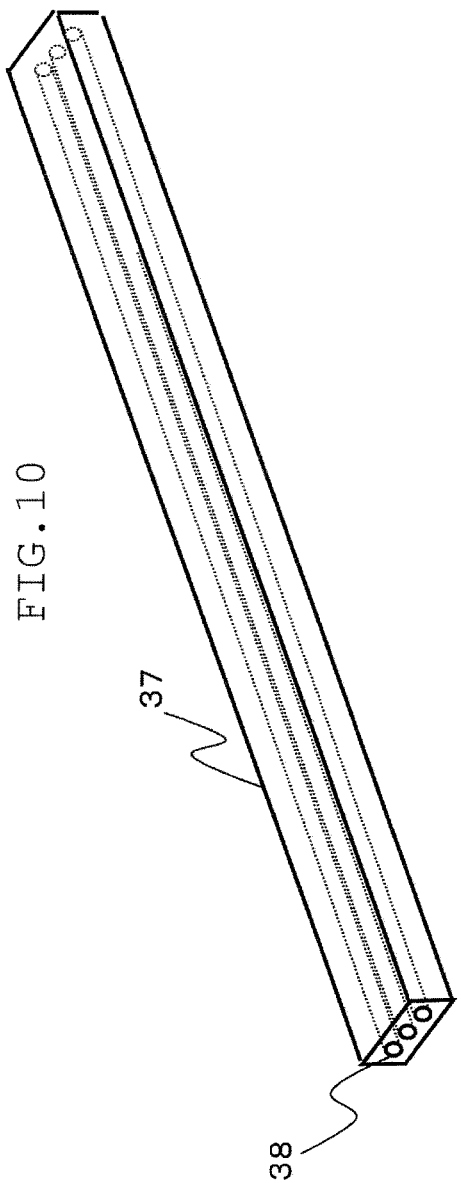
FIG. 10 is another modification example of the magnetic field correction means in FIG. 8.

The characteristic of the present modification is that the second shim trays (shim trays for correcting low-order terms) 37 have long and thin hollows 38 for inserting a rod-shaped shim iron (shim bar) in place of pockets as shown in FIG. 10. Plural hollows 38 are formed in the longitudinal direction of the shim tray 37. The shim bars are placed at the positions determined by the magnetic field adjustment method. As for the method for placing the shim bars, for example a method can be applied which forms the inner wall of hollows 38 on a male screw and the outer periphery of shim bars on a female screw, then fixes the shim bars at the end of a predetermined jig so that the shim bars can be moved while being rotated to predetermined positions.

By forming plural hollows, it is possible to add shim irons for fine-adjusting the shim quantity when the magnetic force of a shim iron placed in one hollow is not sufficient. The placement positions of the shim bars are the same as those in the above-described second shim trays 32 and 36, in both of the end portions and the central portion in the shim trays 37.

<Embodiment 2>

Next as Embodiment 2 of a static magnetic field generation device, a circular disc-shaped static magnetic field generation device will be described which is preferable for an MRI apparatus of the vertical magnetic field method in which the static magnetic field generation unit is circular-disc shaped and the static magnetic field direction is orthogonal to the circular disc.

Figure 11:
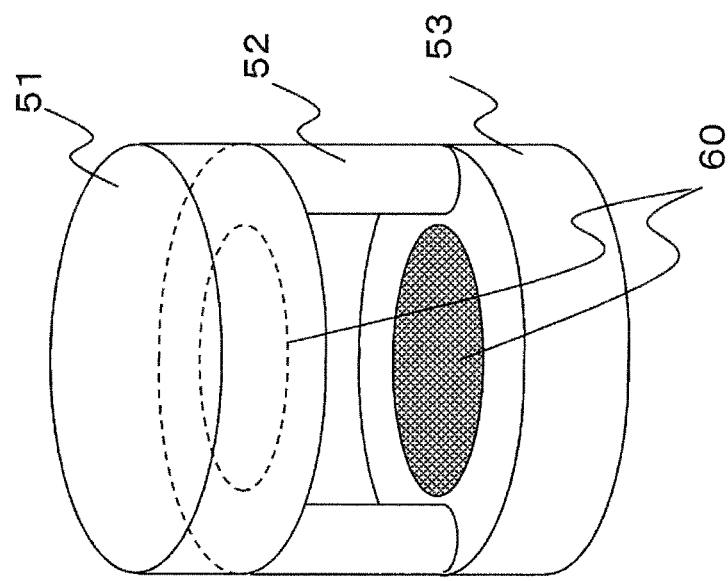
FIG. 11 is the outline of a static magnetic field generation device of the vertical magnetic field method in Embodiment 2.

FIG. 11 shows the outline of a static magnetic field generation device of the vertical magnetic field method. The static magnetic field generation device has a configuration in which a pair of superconducting magnets 51 and 52 are disposed with a space and columnar supports 53 therebetween, wherein uniform static magnetic field S is formed in the space between the pair of superconducting magnets. Though omitted in the diagram, the superconducting magnets are respectively stored in a vacuum container and kept at a predetermined low temperature by cooling medium.

Figure 12:
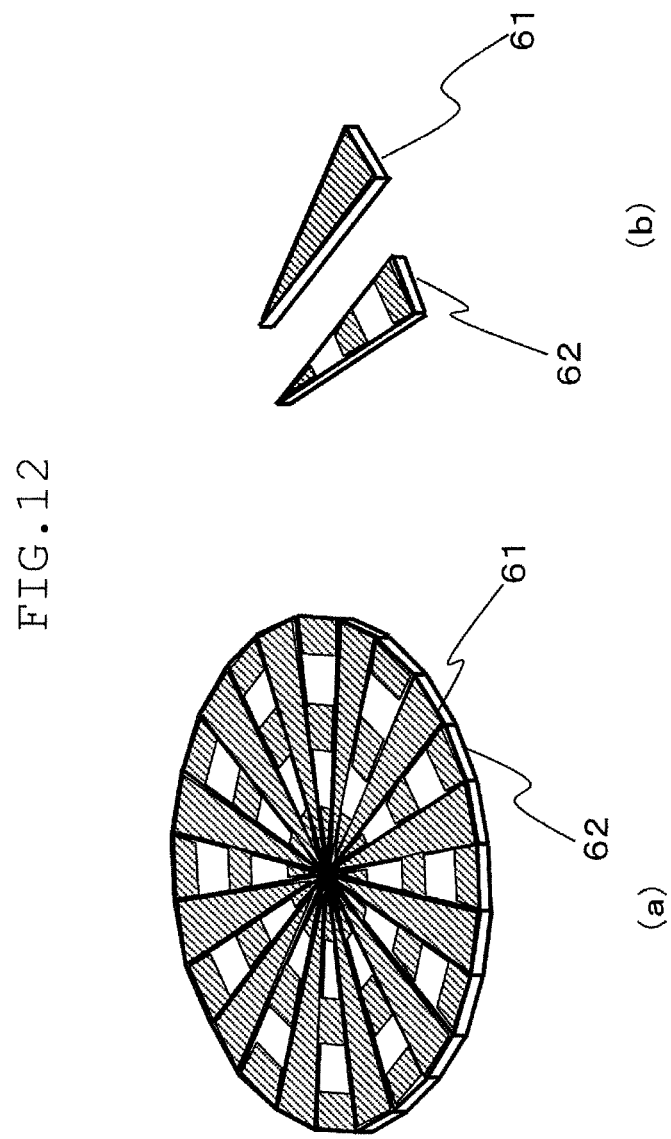
FIG. 12 show an example of magnetic field correction units of the static magnetic field generation device in FIG. 11, in which (a) shows a shim tray group formed by plural shim trays, and (b) shows individual shim trays.

Shim tray storage portions 60 which are magnetic field correction units are disposed on the side facing the static magnetic field space of the superconducting magnets. FIG. 12 shows the configuration of a shim tray to be disposed in the shim tray storage portions 60. The shim trays of the present embodiment form approximately a circular-disc shape when all parts are disposed in the shim tray storage portion 60 as shown in FIG. 12(a), and individual shim trays have a sector form in which the circular disc is segmented in radial directions (FIG. 12(b)). The shim trays in the present embodiment are also formed by two kinds of shim trays 61 and 62, wherein the first shim trays 61 are for correcting the irregular magnetic field of high orders, and approximately the entire region of each sector form is provided with a shim iron placement region. The second shim trays 62 are for correcting the irregular magnetic field of low orders, and each shim tray is provided with shim iron placement regions which are separated in the radial direction. In the diagram, the shaded regions indicate the shim iron placement regions. Static magnetic field generation unit has approximate circular-disc shape, and the shim trays have the shape in which the circular disc is segmented plurally along the radii and disposed in a circular-disc shape being parallel with the circular-disc shape of the static magnetic field generation unit.

Figure 13:
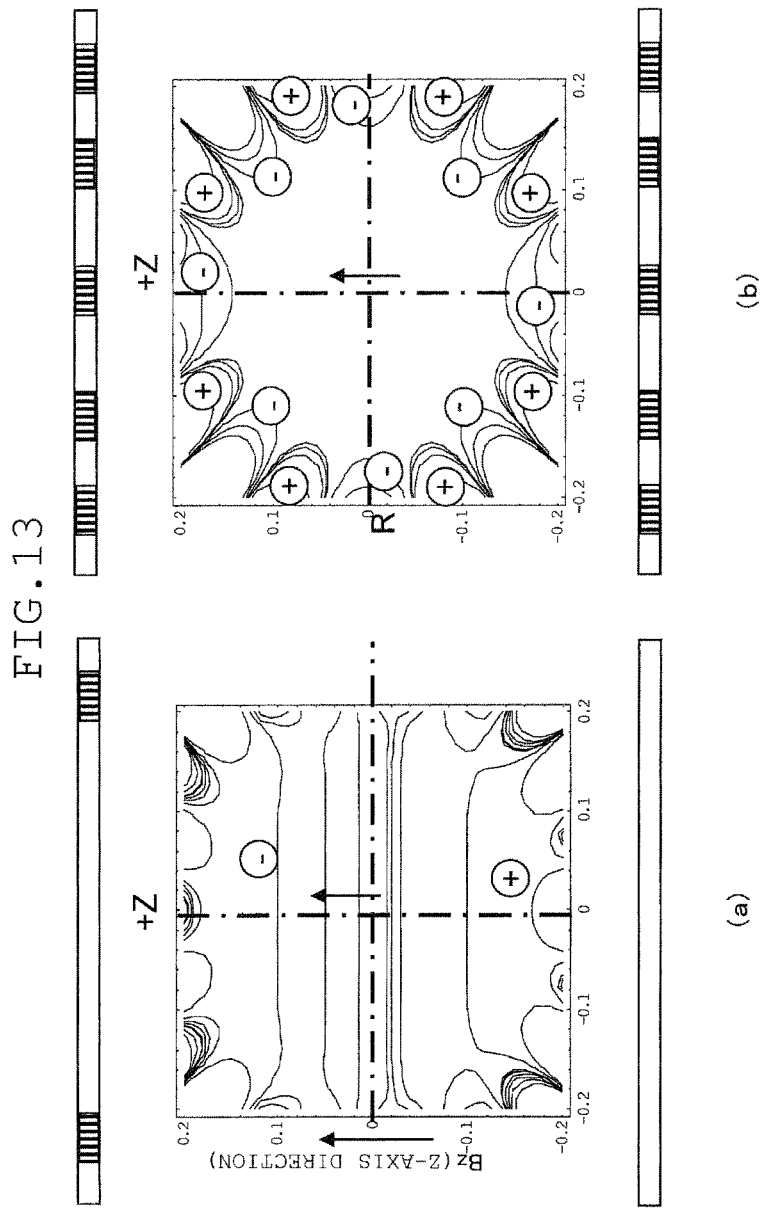
FIG. 13 shows the magnetic field distribution in a disk-shaped static magnetic field generation device and the placement of shim irons for correcting the distribution, in which (a) shows the irregular magnetic field of the first-order term and (b) shows the irregular magnetic field of the eighth-order term.

The magnetic field distribution in the circular disk-shaped static magnetic field generation device is shown in FIGS. 13 (a) and (b). FIG. 13(a) shows the inhomogeneity components of the first order, and (b) shows the inhomogeneity components of the eighth-order. In these cases, the inhomogeneity components of low-orders (the first-order) can also be corrected by placing the shim irons in the outer-circumferential portion in the radial direction of the +Z side or −Z side, and the inhomogeneity components of the high orders can be corrected by placing the shim irons discretely in the radial direction of the tray on the +Z side or the −Z side, and the inhomogeneous components of high orders can also be corrected by discretely placing the shim irons in the radial direction with respect to the direction vertical to the Z-direction. Therefore, the adjustment of the high-order components and the low-order components can be carried out by using the above-described different shim trays 61 and 62 as appropriate.

As the magnetic field adjustment method, the one as shown in FIG. 2 can also be applied in Embodiment 2, for attaining the effect such as reducing the helium consumption and the adjustment workload. In this regard, however the first and the second adjustment steps include the step of disposing magnetic field correction units along the line in plural radial directions on the concentric virtual circular disc of the circular disc. Also, the virtual line on which the magnetic field correction units is disposed in the first adjustment step and the virtual line on which the magnetic field correction units is disposed in the second step are to be placed alternately.

<Magnetic Field Adjustment System>

Figure 14:
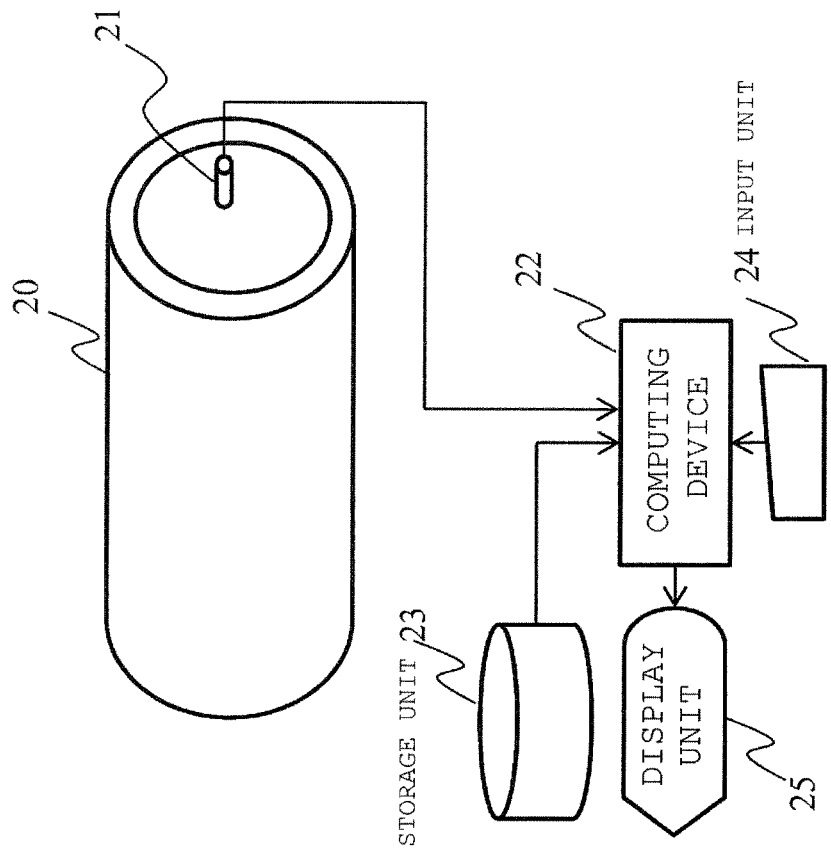
FIG. 14 is the outline of a magnetic field adjustment system.

Next, the magnetic field adjustment system to be used in the magnetic field adjustment method of the present invention will be described. The outline of the magnetic field adjustment system is shown in FIG. 14. The magnetic field adjustment system comprises a magnetic field measuring probe 21 configured to measure the magnetic field distribution in a static magnetic field space formed by a static magnetic field generation device 20, a computer 22 configured to determine the shim quantity such as the placement positions and the placement quantity of the shim irons to be placed in a shim tray using the magnetic field distribution measured by the magnetic field measuring probe 21, and a storage unit 23 configured to store the information which is necessary for the calculation by the computer 22 such as the kind of shim tray for disposing shim irons or the magnetic force of the shim irons.

As for the magnetic field measuring probe 21, a magnetic field measuring device using the Hall elements generally known as a tesla meter or a magnetic field measuring device utilizing the NMR can be used.

The computer 22 can be configured by a general computer comprising input units 24 such as a mouse and a keyboard and a display unit 25 such as a display. The storage unit 23 stores the information input via an input unit of the computer 22, and is equipped with calculation software for achieving the calculation function of the computer 22. The calculation function of the computer 22 includes: (1) the function to expand the measured static magnetic field in a certain series (the calculation previously mentioned in (1)); (2) the function to calculate the shim placement regions in accordance with the term of series; and (3) the function to determine after the first magnetic field adjustment that the magnetic field distribution of high orders and the static magnetic field homogeneity reached a certain threshold value so that the second magnetic field adjustment step can be carried out.

In the calculation software, the placement condition of shim trays such as the number of shim trays, the number of pockets therein, the position of pockets and the magnetization magnitude of shim irons are set as input data in a cylindrical magnet, and the shim placement regions in accordance with the input data are set as the output data.

The present embodiment is provided with at least two kinds of input data having different formats, wherein input data 1 having the number of first shim trays 31 shown in FIG. 8, the number of pockets, and the positions of pockets is used in the first magnetic field adjustment step (step 210 in FIG. 2) and input data 2 having the number of second shim trays 32, the number of pockets and the positions of pockets is used in the second magnetic field adjustment step (step 220 in FIG. 2).

Figure 15:
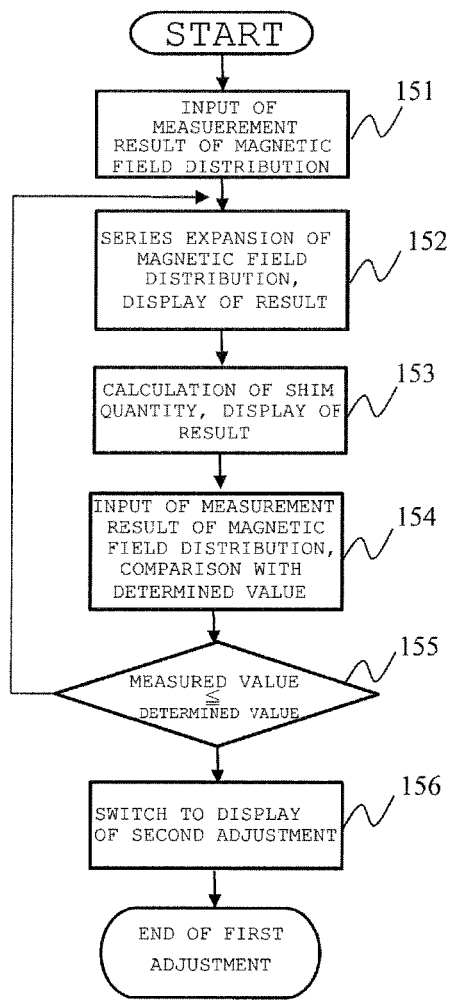
FIG. 15 is a flowchart showing the operation of the magnetic field adjustment system.

The calculation procedure of the computer 22 in this magnetic field adjustment system is shown in FIG. 15.

First, when the measurement result by the magnetic field measuring probe 21 is input (step 151), the magnetic field distribution is expanded in a series by the spherical surface harmonics, and the result thereof is displayed on the display unit 25 (step 152). A display example is shown in FIG. 16.

As shown in the diagram, the kind of shim tray and the shim tray to be used for the first magnetic field adjustment are displayed, and the amount of irregular magnetic field in the respective expanded series is also displayed. In order to mainly correct the irregular magnetic field including high orders in the first magnetic field adjustment step, the amount of irregular magnetic field is displayed with respect to all terms in the series, for example the terms $Za(N,0)$ ($N=1\sim10$), $Za$ and $Zb$ $(N,M)$ ($N=1\sim5$, $M=1\sim5$). At the same time, the determination values with respect to the high-order terms in which $N=5$ or higher are displayed. The one who performs the adjustment, when the irregular magnetic field of high-order terms in which $N=5$ or higher displayed on the display unit 25 becomes lower than the determination value, can perform the second magnetic field adjustment, i.e. ship and install the static magnetic field generation device at the final installation site. The determination value of high-order terms is to be set in advance so that the statistic magnetic field homogeneity can be attained in a desired space when the final magnetic field adjustment is completed.

Figure 17:
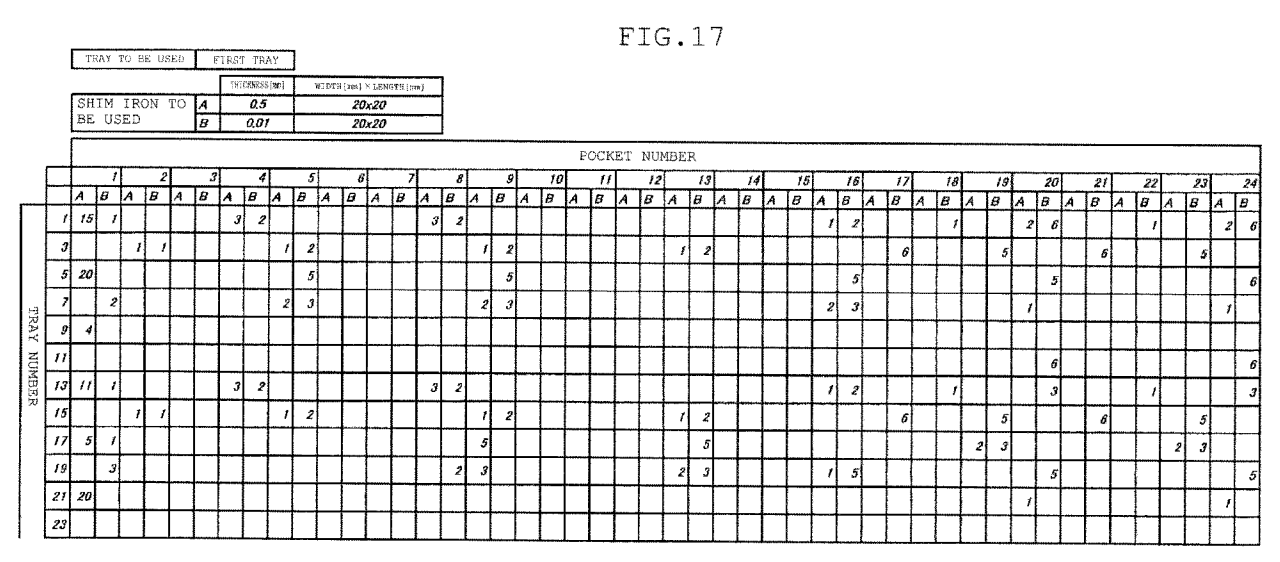

Next, the shim quantity for adjusting the irregular magnetic field of high-order terms which are the fifth-order and higher is calculated, and the result thereof is displayed on the display unit (step 153). The calculation of shim quantity is performed by the optimization method using input data 1 regarding the first shim tray which is input in advance. The calculation result (output) is given as the number of the shim tray (tray number), pocket number, kind of shim iron, and placement quantity (number of pieces) of shim trays. A display example thereof is shown in FIG. 17. The longitudinal row of the table shown in the diagram indicates the tray number and the lateral row thereof indicates the pockets, wherein the shim tray group with odd numbers $1\sim23$ is used here and two kinds of shim irons A and B having different magnetization quantities are placed in any of the pockets $1\sim20$. For example, FIG. 17 indicates that 15 pieces of shim irons A and one piece of shim iron B are to be placed in pocket number 1 of tray number 1.

Steps 152 and 153 are repeated until the irregular magnetic field quantity of the fifth-order term or higher reaches the determination value displayed on the display unit or lower (steps 154 and 155). The first magnetic field adjustment step is completed when the irregular magnetic field quantity of high-order terms reaches the determination value or lower. At this time, the display function is switched from the first magnetic field adjustment to the second magnetic field adjustment (step 156).

In the second magnetic field adjustment step, when the measurement result by the magnetic field measuring probe 21 is input, the magnetic field distribution is first expanded in a series by the spherical surface harmonics and the result thereof is displayed on the display unit 25 as in the above-described first magnetic field adjustment steps 151~154. A display example is shown in FIG. 18. Here, the kind of shim tray and the kind of shim iron to be used are also displayed. As for the irregular magnetic field quantity, since the objective of the second magnetic field step adjustment step is to adjust the irregular magnetic field of low order terms, the low-order terms are displayed brightly and the high-order terms are displayed darkly.

Next, the shim quantity for adjusting the lower-order terms of the fourth-order or lower is calculated using input data 2 regarding the second shim tray, and the result is displayed on the display unit. A display example is shown in FIG. 19. Here, the tray number of second shim trays (even numbers of $2\sim24$), pocket number ($1\sim12$), the kind of shim irons and the placement quantity (number of pieces) are displayed in a table. For example, it is indicated that one piece of shim iron C and one piece of shim iron D are placed in the first pocket of the shim tray number 2, one piece of shim iron C and two pieces of shim irons D are placed in the 12$^{th}$ pocket of shim tray number 4, and three pieces of shim irons C and two pieces of shim irons D are placed in the 8$^{th}$ pocket.

The display of the second step shown in FIG. 18 and FIG. 19 are automatically switched at the point that the first magnetic field adjustment is completed, which serves as a guidance for an adjuster. In other words, though there are cases in which an adjuster changes between the time of shipment and the time of final adjustment of a static magnetic field generation device, the second magnetic field adjustment can be carried out at the final installation site by taking over the first magnetic field adjustment (steps 151~154) as it is.

Accordingly, the above-described embodiment is capable of providing a static magnetic field generation device for magnetic resonance imaging which generates a static magnetic field in an imaging space in which an examination target is placed, comprising:
a static magnetic field generation unit; and
magnetic field correction unit configured to adjust a static magnetic field,
wherein magnetic field correction unit comprises shim trays having plural storage portions for storing magnetic body pieces, and comprises as shim trays a first shim tray configured to adjust at least the irregular magnetic field components of high-order terms and a second shim tray configured to adjust at least the irregular magnetic field components of low-order terms.

Also, a magnetic field adjustment system is provided for adjusting the homogeneity of a static magnetic field generated by a static magnetic field generation device, comprising:
magnetic field measuring unit configured to measure the magnetic field distribution of the static magnetic field;
a storage unit configured to store magnetic field correction to be used for adjusting the homogeneity of a static magnetic field; and
a calculation unit configured to calculate the shim quantity using the magnetic field distribution measured by magnetic field measuring unit and the information of magnetic field correction unit stored in the storage unit,
wherein calculation unit performs, from the measured magnetic field distribution, a first calculation which calculates the shim quantity for correcting the irregular magnetic field of high-order terms and a second calculation which calculates the shim quantity for correcting the irregular magnetic field of low-order terms. The magnetic field correction unit is a shim tray and a magnetic body shim to be placed in the shim tray, and calculation unit calculates the placement positions and the number of the magnetic body shims in a shim tray.

Also in accordance with the above-described embodiment, a program may be provided for performing the calculation including steps of:
inputting data of the measured homogeneity in the static magnetic field and expanding the data in a series;
inputting, as the condition of shim trays, the number of shim trays, the positions and the number of magnetic body shim storage portions in the respective shim trays and the magnetization magnitude of magnetic body shims, for each of shim tray for high-order terms and shim tray for low-order terms;
calculating the placement positions and the number of magnetic body shims preferable for correcting the irregular magnetic field components of high-order terms from among the irregular magnetic fields expanded in a series using the input condition of shim trays for high-order terms; and
calculating the placement positions and the number of magnetic body shims preferable for correcting the irregular magnetic field components of low-order terms using the input condition of shim trays for low-order terms.

A method for adjusting static magnetic field homogeneity may also be provided which adjusts the homogeneity of the static magnetic field by placing magnetic field correction unit configured to generate a corrected magnetic field with respect to the static magnetic field generated in a measurement space by static magnetic field generation unit, including:
measuring a static magnetic field generated by the static magnetic field generation unit;
expanding the spatial distribution of the measured static magnetic field in a series; and
adjusting the irregular magnetic field components of high-order terms from among the irregular magnetic field components that are expanded in a series, prior to the adjustment of the irregular magnetic field of low-order terms. Also, a method for adjusting static magnetic field homogeneity may be provided which adjusts the homogeneity of the static magnetic field by placing magnetic field correction units configured to generate a corrected magnetic field with respect to the static magnetic field generated in a measurement space by static magnetic field generation unit, wherein the static magnetic field is the one in which, from among the irregular magnetic field components of which the spatial distribution is expanded in a series, the irregular magnetic field components of high-order terms are corrected by a first magnetic field correction unit, including adjusting the irregular magnetic field components of low orders from among the irregular magnetic field components that are expanded in a series.

INDUSTRIAL APPLICABILITY

In accordance with the present invention, it is possible to quickly and easily improve the homogeneity of the magnetic field generated by a static magnetic field generation device using a superconducting magnet. The quality of MR images by an MRI apparatus can be improved by using the static magnetic field generation device of the present invention in which the magnetic field homogeneity is improved.

DESCRIPTION OF REFERENCE NUMERALS

2: cylindrical bore, 3, 60: shim tray storage portion, 5, 51, 52: vacuum case (superconducting magnet), 31, 33, 61: first shim tray (shim tray for correcting high-order terms), 32, 35, 37, 62: second shim tray (shim trays for correcting low-order terms), 10, 20: static magnetic field generation device, 21: magnetic field measuring probe, 22: computer, 23: storage unit, 24: input unit, 25: display unit

The invention claimed is:
1. A method for adjusting the homogeneity of a static magnetic field generated by a static magnetic field generation unit in a measurement space by placing a magnetic field correction unit that generates a corrected magnetic field, the method including:
measuring the static magnetic field generated by the static magnetic field generation unit;

expanding a spatial distribution of the measured static magnetic field in a series;

first magnetic field adjustment for adjusting irregular magnetic field components of high-order terms from among irregular magnetic field components that are expanded in the series; and second magnetic field adjustment for adjusting irregular magnetic field components of low-order terms from among the irregular magnetic field components that are expanded in the series, to be executed after the first magnetic field adjustment, wherein;

the static magnetic field generation unit has a shape of a circular cylinder in which the static magnetic field direction is parallel with a longitudinal axis of the circular cylinder, each of the first and second magnetic field adjustments includes placing the magnetic field correction unit along plural virtual lines which are on a virtual circular cylinder that is concentric with the circular cylinder of the static magnetic field generation unit, and said virtual lines are parallel with the axis of the circular cylinder, and the virtual lines on which the magnetic field correction units are placed in the first magnetic field adjustment and the virtual lines on which the magnetic field correction units are placed in the second magnetic field adjustment are arrayed alternately.

2. The method for adjusting the homogeneity of a static magnetic field according to claim 1, wherein the first magnetic field adjustment and the second magnetic field adjustment use different magnetic field correction units.

3. The method for adjusting the homogeneity of a static magnetic field according to claim 2, wherein first shim trays for adjusting at least the irregular magnetic field components of high-order terms are used in the first magnetic field adjustment, and second shim trays for adjusting at least the irregular magnetic field of low-order terms are used in the first magnetic field adjustment.

4. The method for adjusting the homogeneity of a static magnetic field according to claim 1, wherein the irregular magnetic field components of low-order terms are the components of the fourth-order or lower.

5. The method for adjusting the homogeneity of a static magnetic field according to claim 1, wherein:

the static magnetic field generation unit has a disc-shaped form in which the static magnetic field direction is orthogonal to the disc; and the first and second adjustments include placing the magnetic field correction unit along plural lines which are on a virtual disc that is concentric with the disc and are in the radial direction of the virtual disk.

6. The method for adjusting the homogeneity of a static magnetic field according to claim 1, wherein at least one of the magnetic field correction units comprises a magnetic body shim.

7. A method for adjusting the homogeneity of a static magnetic field generated by a static magnetic field generation unit in a measurement space by placing a magnetic field correction unit which generates a corrected magnetic field, the method including:

measuring the static magnetic field generated by the static magnetic field generation unit;

expanding a spatial distribution of the measured static magnetic field in a series;

first magnetic field adjustment for adjusting irregular magnetic field components of high-order terms from among irregular magnetic field components that are expanded in the series, in a first installation site at which the static magnetic field generation unit is placed; and second magnetic field adjustment for adjusting the irregular magnetic field components of low-order terms from among the irregular magnetic field components that are expanded in the series, after the static magnetic field generation unit is transferred to a second installation site which is different from the first site, wherein:

the static magnetic field generation unit has a shape of a circular cylinder in which the static magnetic field direction is parallel with a longitudinal axis of the circular cylinder, each of the first and second magnetic field adjustments includes placing the magnetic field correction unit along plural virtual lines which are on a virtual circular cylinder that is concentric with the circular cylinder of the static magnetic field generation unit, and said virtual lines are parallel with the axis of the circular cylinder, and the virtual lines on which the magnetic field correction units are placed in the first magnetic field adjustment and the virtual lines on which the magnetic field correction units are placed in the second magnetic field adjustment are arrayed alternately.

8. A static magnetic field generation device for magnetic resonance imaging which generates a static magnetic field in an imaging space in which an examination target is placed, comprising:

a static magnetic field generation unit: and a magnetic field correction unit configured to adjust the static magnetic field, wherein the magnetic field correction unit comprises shim trays having plural storage portions for storing magnetic body pieces, that are first shim trays for adjusting at least the irregular magnetic field of high-order terms and second shim trays for adjusting at least the irregular magnetic field of low-order terms, and wherein the first shim trays and the second shim trays are disposed alternately.

9. The static magnetic field generation device for magnetic resonance imaging according to claim 8, wherein the number and/or the size are different between magnetic body pieces to be stored in the first shim trays and magnetic body pieces to be stored in the second shim trays.

10. The static magnetic field generation device for magnetic resonance imaging according to claim 8, wherein:

the first shim trays have the storage portions that are formed evenly over the longitudinal direction; and the second shim trays have the regions provided with no storage portions and the regions provided with storage portions, in the longitudinal direction.

11. The static magnetic field generation device for magnetic resonance imaging according to claim 8, wherein:

the static magnetic field generation device has approximately a circular-cylindrical shape, and the shim trays have a rod-like shape, and are disposed inside of the circular cylinder in the static magnetic field generation unit along the axis direction thereof.

12. The static magnetic field generation device for magnetic resonance imaging according to claim 8, wherein:
the static magnetic field generation unit has approximately a disc shape; and
the shim trays have a shape in which a disc is plurally segmented along the radii, and are disposed in a disc-shaped form which is parallel with the disc shape of the static magnetic field generation unit.

* * * * *